United States Patent
Akarvardar

(10) Patent No.: US 9,515,088 B1
(45) Date of Patent: Dec. 6, 2016

(54) HIGH DENSITY AND MODULAR CMOS LOGIC BASED ON 3D STACKED, INDEPENDENT-GATE, JUNCTIONLESS FINFETS

(71) Applicant: GLOBALFOUNDRIES Inc., Grand Cayman (KY)

(72) Inventor: Murat Kerem Akarvardar, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/040,278

(22) Filed: Feb. 10, 2016

(51) Int. Cl.
  *H01L 27/11* (2006.01)
  *H01L 27/118* (2006.01)
(52) U.S. Cl.
  CPC ............ *H01L 27/11807* (2013.01); *H01L 2027/11857* (2013.01); *H01L 2027/11859* (2013.01)
(58) Field of Classification Search
  CPC ............ H01L 27/11807; H01L 2027/11859; H01L 2027/11857
  See application file for complete search history.

(56) References Cited

U.S. PATENT DOCUMENTS 7,368,788 B2    5/2008  Huo et al.
8,178,862 B2    5/2012  Colinge
2014/0035041 A1*  2/2014  Pillarisetty ............ H01L 21/845
                                                        257/365
2015/0021691 A1    1/2015  Akarvardar et al.

OTHER PUBLICATIONS

L. Mathew et al., "CMOS Vertical Multiple Independent Gate Field Effect Transistor (MIGFET)", IEEE, SOI Conference 2004, pp. 187-189, Oct. 2004.
X. Wu et al., "A Three-Dimensional Stacked Fin-Cmos Technology for High-Density Vlsi Circuits", IEEE Transactions on Electron Devices, vol. 52, No. 9, pp. 1998-2003, Sep. 2005.
M. Weis et at., "Circuit Design with Independent Double Gate Transistors", Advances in Radio Science, 7, pp. 231-236, 2009.
A. Kamath et al., "Realizing and and or Functions With Single Vertical-Slit Field-Effect Transistor", IEEE Electron Device Letters, Vo. 33, No. 2, pp. 152-154, Feb. 2012.

* cited by examiner

*Primary Examiner* — Roy Potter
*Assistant Examiner* — Paul Patton
(74) *Attorney, Agent, or Firm* — Heslin Rothenberg Farley & Mesiti, P.C.; Teige P. Sheehan, Esq.

(57) ABSTRACT

A semiconductor structure is provided with fins on a substrate, including: a first active layer with a first source, first channel, and first drain, each doped with the same concentration of dopant as each other; a dielectric layer on the first active layer; a second active layer with a second source, second channel, and second drain, each doped with the same concentration of dopant as each other; and a first and second gate disposed on an opposing first and second sidewall of the channels, respectively. A method for making such a semiconductor structure is also provided.

20 Claims, 15 Drawing Sheets

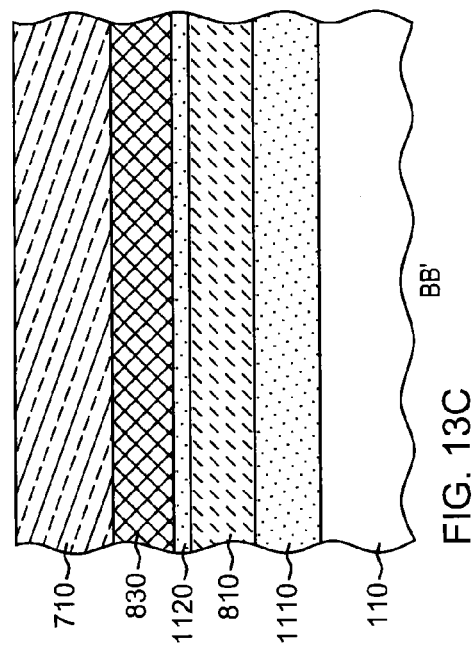
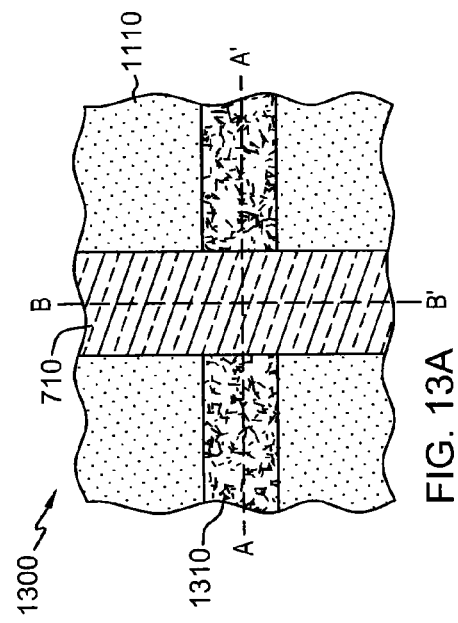
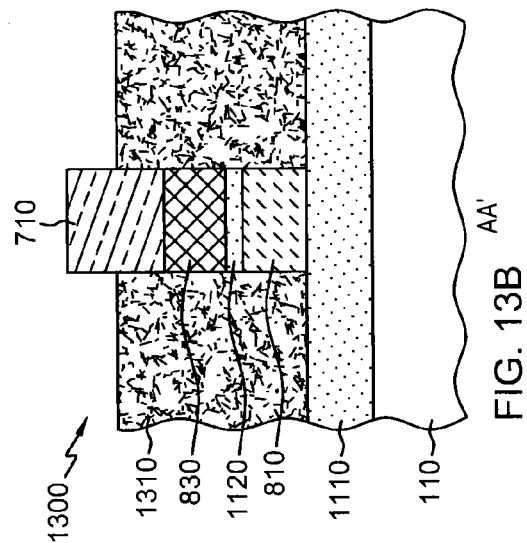

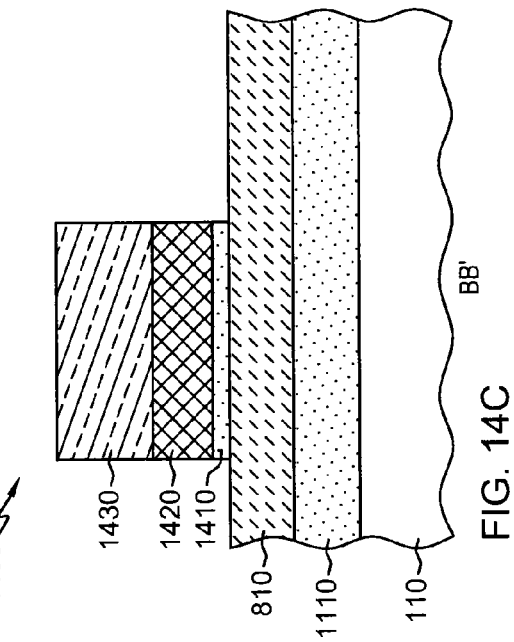
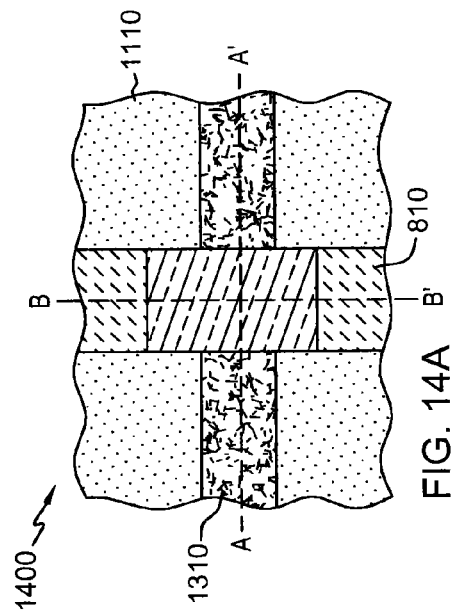
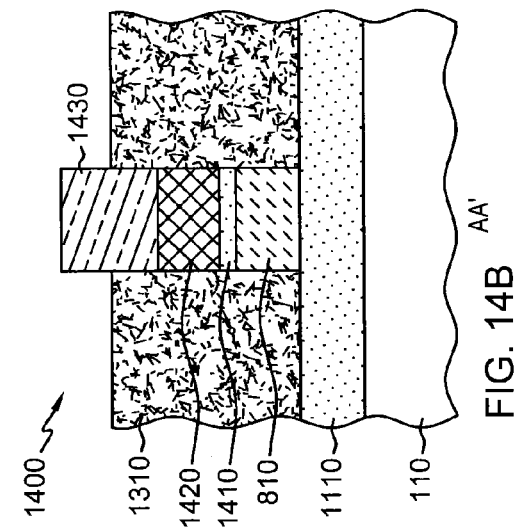
FIG. 14A
FIG. 14B
FIG. 14C

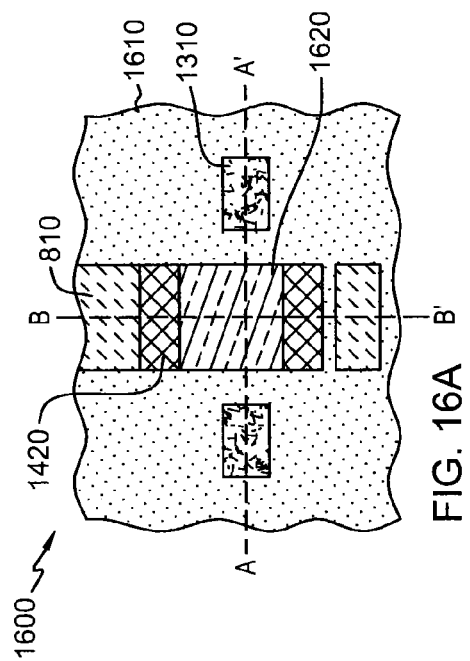
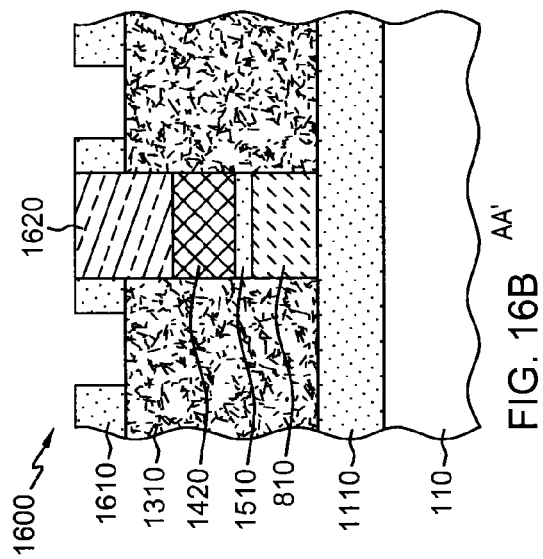
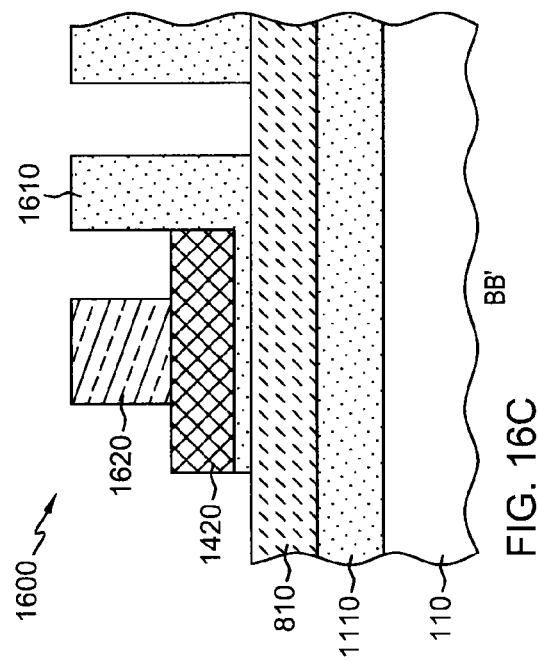

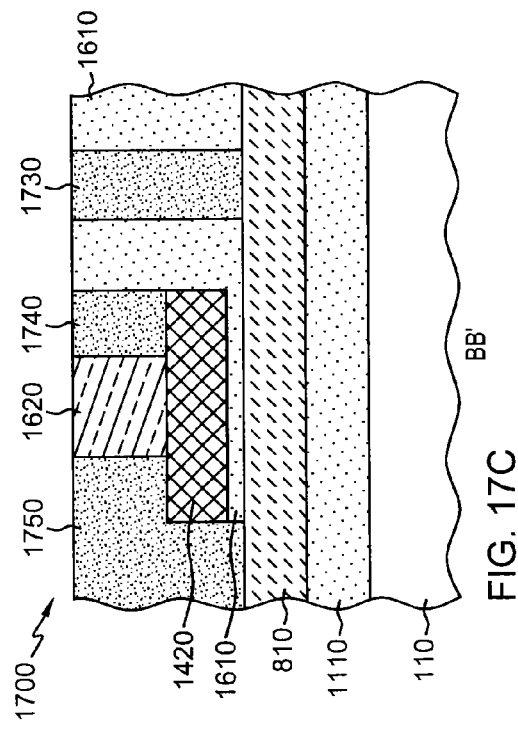
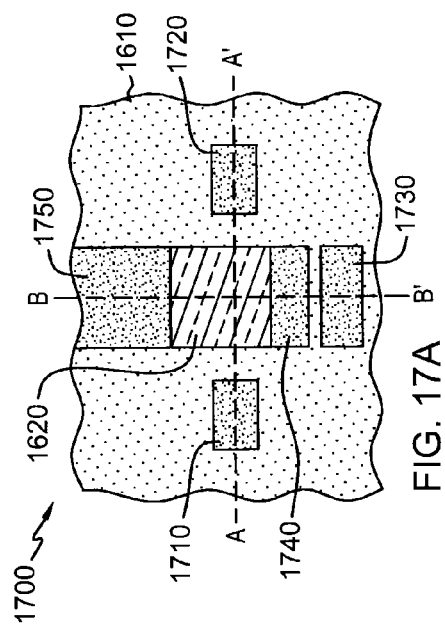
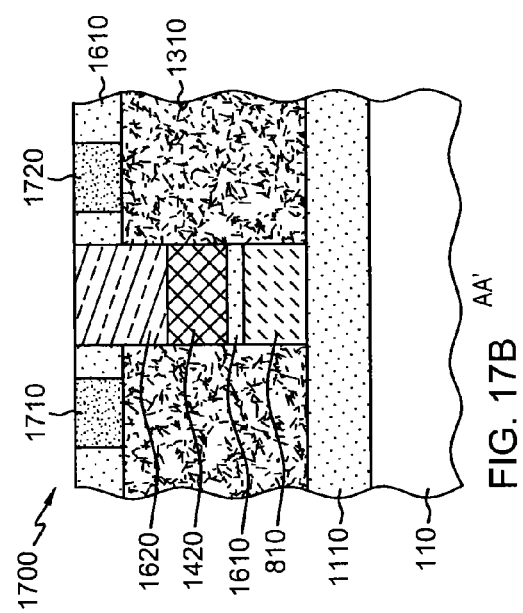
FIG. 17C
FIG. 17A
FIG. 17B

| I1 | I2 | n+ ch | p++ ch | out |
|----|----|-------|--------|-----|
| 0  | 0  | off   | on     | 1   |
| 0  | 1  | off   | on     | 1   |
| 1  | 0  | off   | on     | 1   |
| 1  | 1  | on    | off    | 0   |
|    |    | AND   | OR     | NAND |

FIG. 18

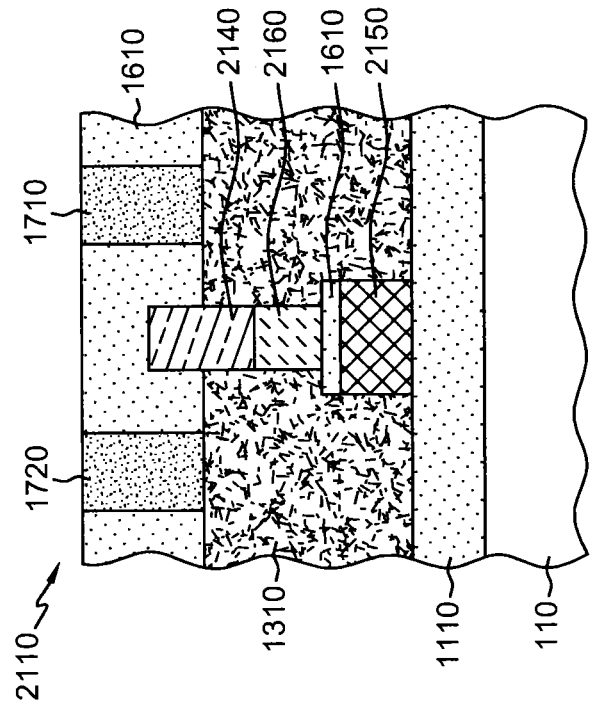
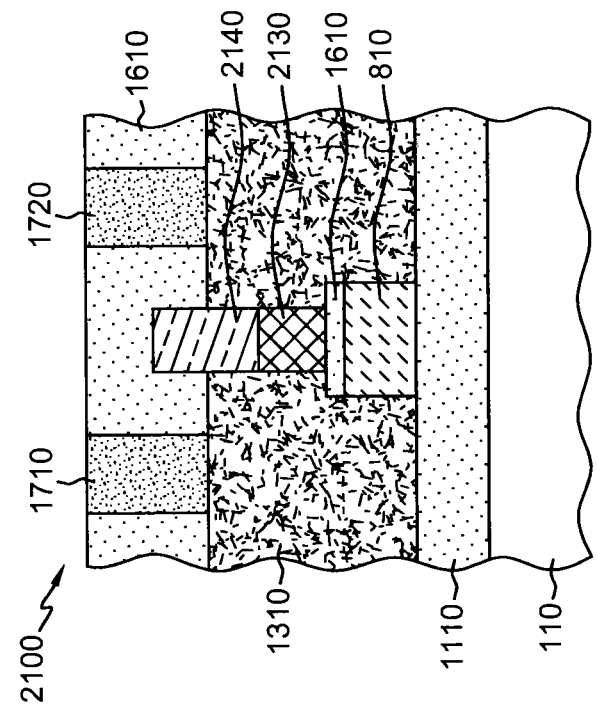

HIGH DENSITY AND MODULAR CMOS LOGIC BASED ON 3D STACKED, INDEPENDENT-GATE, JUNCTIONLESS FINFETS

FIELD OF THE INVENTION

The present invention relates to semiconductor devices and methods of fabricating semiconductor devices, and more particularly, to methods and devices for 3D stacked, independent-gate, junctionless FinFETs.

BACKGROUND OF THE INVENTION

Semiconductor structures, such as, integrated circuits are formed from semiconductor substrates within and upon whose surfaces may be formed electrical circuit elements such as transistors including field-effect transistors (FETs). Conventionally, field-effect transistors have been fabricated as planar circuit elements.

Fin field-effect transistor (FinFET) devices are currently being developed to replace conventional planar transistors, such as metal oxide semiconductor field-effect transistors (MOSFETs), in advanced complementary metal oxide semiconductor (CMOS) technology, due to their improved short channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes etc.

As described by Moore's Law, the semiconductor industry drives down pattern dimensions in order to reduce transistor size and enhance processor speed at a rapid pace. Further enhancements in fin device structures and fabrication methods therefor continue to be pursued for enhanced performance and commercial advantage.

SUMMARY OF THE INVENTION

The shortcomings of the prior art are overcome and additional advantages are provided through the provision, in one aspect, of a semiconductor structure including one or more fins disposed on a substrate, the one or more fins including: a first active layer disposed on the substrate with a first source, a first channel, and a first drain, wherein the first source, first channel, and first drain are doped with a concentration of a first dopant and the concentration of the first dopant is the same in the first channel as it is in the first source and the first drain; a dielectric layer disposed on the first active layer; a second active layer disposed on the dielectric layer including a second source, a second channel, and a second drain, wherein the second source, second channel, and second drain are doped with a concentration of a second dopant and the concentration of the second dopant is the same in the second channel as it is in the second source and the second drain; a first gate disposed on a first sidewall of the first channel and of the second channel; and a second gate disposed on a second sidewall of the first channel and of the second channel wherein the second sidewall is opposite the first sidewall.

In another aspect, a method a method of making a semiconductor structure is provided including disposing a first active layer on a semiconductor substrate and doping the first active layer with a first dopant; disposing a sacrificial layer on the first active layer wherein the sacrificial layer includes an oxidizable material; disposing a second active layer on the sacrificial layer and doping the second active layer with a second dopant; etching the first active layer, the sacrificial layer, and the second active layer wherein etching includes forming one or more fins; oxidizing the sacrificial layer wherein oxidizing includes transforming the sacrificial layer into a dielectric layer; disposing a first gate on a first sidewall of the one or more fins and a second gate on a second sidewall of the one or more fins wherein the first gate is opposite the second gate; wherein disposing includes forming a first source, a first channel, and a first drain in the first active layer having a concentration of the first dopant that does not substantially differ between the first source, first channel, and first drain, and a second source, a second channel, and a second drain in the second active layer having a concentration of the second dopant that does not substantially differ between the second source, second channel, and second drain.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 13A is a plan view, and FIGS. 13B and 13C are orthogonal cross-sectional elevation views corresponding to the AA' and BB' sightlines of FIG. 13A, respectively, of partial semiconductor substrate of FIG. 12 after recessing the gate electrode layer in accordance with one or more aspects of the present invention;

FIG. 14A is a plan view, and FIGS. 14B and 14C are orthogonal cross-sectional elevation views corresponding to the AA' and BB' sightlines of FIG. 14A, respectively, of partial semiconductor substrate of FIGS. 13A-C, respectively, after etching a portion of the hard mask layer, a doped layer, and the oxide layer, in accordance with one or more aspects of the present invention;

FIG. 16A is a plan view, and FIGS. 16B and 16C are orthogonal cross-sectional elevation views corresponding to the AA' and BB' sightlines of FIG. 16A, respectively, of partial semiconductor substrate of FIGS. 15A-C, respectively, after selective etching of part of the oxide layer in accordance with one or more aspects of the present invention;

FIG. 17A is a plan view, and FIGS. 17B and 17C are orthogonal cross-sectional elevation views corresponding to the AA' and BB' sightlines of FIG. 17A, respectively, of partial semiconductor substrate of FIGS. 16A-C, respectively, after performance of a metallization step in accordance with one or more aspects of the present invention;

FIG. 18 is a truth table for a NAND2 gate in accordance with one or more aspects of the present invention;

FIGS. 21A and 21B are elevation cross-sectional views of semiconductor gate structures in accordance with one or more aspects of the present invention.

DETAILED DESCRIPTION OF THE INVENTION

Figure 2:
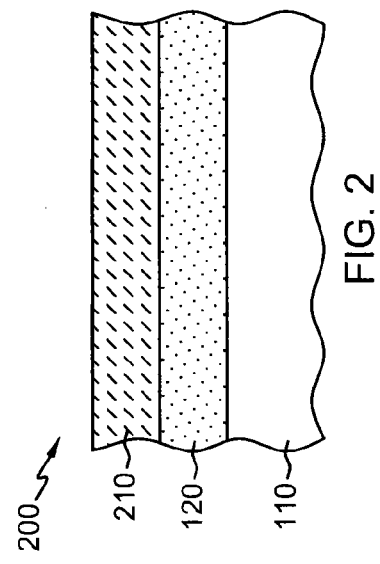
FIG. 2 depicts the partial semiconductor substrate of FIG. 1 after a doping step has been performed in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers may be used throughout different figures to designate the same or similar components.

Generally stated, disclosed herein are certain semiconductor devices, for example, field-effect transistors (FETs), and methods for their manufacture, which provide advantages over conventional semiconductor devices and fabrication processes. Advantageously, the semiconductor device fabrication processes disclosed herein provide for transistors with increased density of logic functionality and increased modularity for combining multiple logic functions in circuitries with smaller footprints than attainable by conventional methods or present in conventional devices.

In an aspect, the invention may include the three-dimensional stacking of multiple, dielectrically isolated device layers, optionally of opposite conductivity type, on a single fin. In another aspect, the invention may include modulating the conductivity of a single fin with multiple independent gates, such as to implement logic functions such as AND or others using a single transistor instead of two. In yet another aspect, the invention may include junctionless FinFETs which, together with the foregoing, enable adoption of, for example, NAND2, NOR2, and inverter functions with only two transistors featuring two independent gates.

Figure 1:
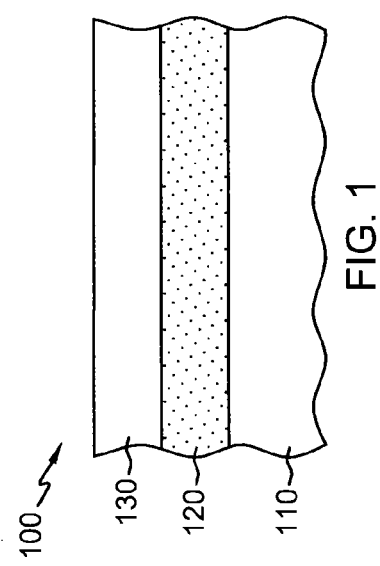
FIG. 1 depicts a partial semiconductor substrate in accordance with one or more aspects of the present invention.

In an embodiment, as shown in FIG. 1, a semiconductor device formation process in accordance with one or more aspects of the present invention may include, for instance: obtaining a partial semiconductor device 100. The partial semiconductor device 100 may be a monocrystalline silicon-on-insulator (SOI) layer 130 on a buried oxide (BOX) layer 120, which is on a silicon substrate 110. An insulating layer other than a BOX layer may also be used. In another embodiment, partial semiconductor device 100 may be manufactured from a bulk silicon substrate. In another embodiment, the electrically insulating BOX layer may be or include an oxide material such as, for instance, silicon oxide material, and may be formed using any conventional fabrication processes, for instance, smart cut and wafer bonding. In one example, the electrically insulating layer may have a thickness within a range of about 200 A to 3500 A, dependent upon the technology nodes in which the semiconductor structure is fabricated. SOI layer 130 may have a thickness in the range of about 50 to 500 A. In a specific example, SOI layer 130 may have a thickness of about 70 A.

A partial semiconductor device 200 shown in FIG. 2 corresponds to that shown in FIG. 1 after performance of a doping step. An n-type dopant may be implanted in n-doped layer 210 using well-known lithographic and implantation techniques. Examples of n-type dopants may include phosphorous, arsenic, antimony, or other donors. In other embodiments, a layer may be doped with a p-type dopant instead. By manipulating known parameters of the doping process, a predetermined, controlled level of doping of n-doped layer 210 may be attained.

Figure 3:
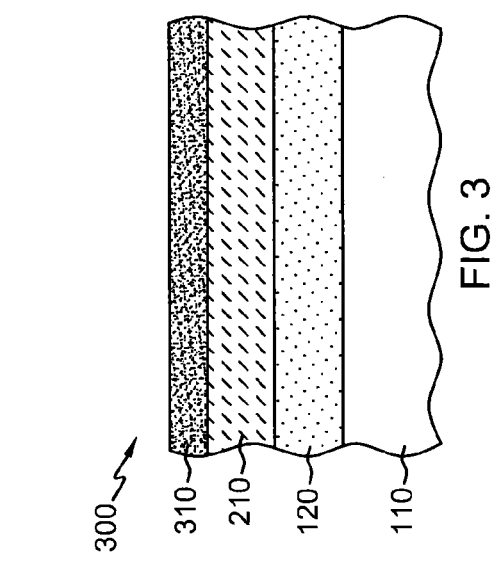
FIG. 3 depicts the partial semiconductor substrate of FIG. 2 after deposition of a sacrificial layer thereupon in accordance with one or more aspects of the present invention.

A partial semiconductor device 300 shown in FIG. 3 corresponds to that shown in FIG. 2 after a selectively oxidizable material 310 has been formed over n-doped layer 210. In one example, the sacrificial layer 310 may include a layer of silicon germanium, which may be expressed as $Si_{1-x}Ge_x$ wherein x, the atomic percentage of germanium in silicon, may be less than or substantially equal to about 1, although the atomic percentage is preferred to be about 0.3 to about 0.7 in the present example. In a specific example, the atomic percentage of germanium present in the layer of silicon germanium may be about 0.5. The silicon germanium sacrificial layer 310, may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD) and molecular beam epitaxy (MBE). In one example, the CVD-based epitaxial growth may take place at a temperature of between about 400° C. to about 900° C., while the molecular beam epitaxy may typically utilize a lower temperature. In a specific example, the selective epitaxial growth of silicon germanium layer 310 may be performed using halogermanes and silanes as the source gases at temperatures below 600° C. The silicon germanium sacrificial layer 310 may have a thickness preferably, of about 5 nanometers to about 30 nanometers, depending on the metastable thickness of the $Si_{1-x}Ge_x$ layer 310.

Figure 4:
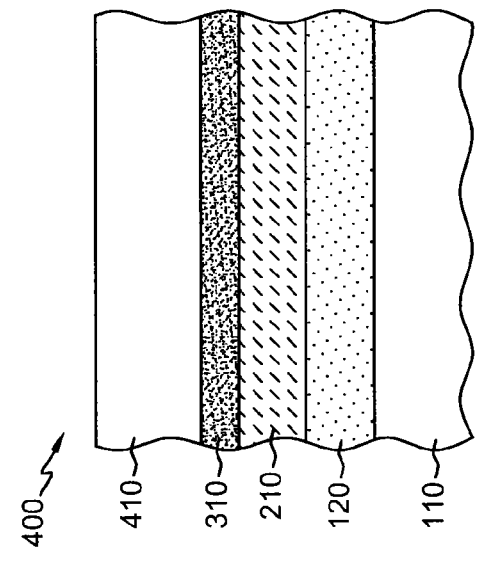
FIG. 4 depicts the partial semiconductor substrate of FIG. 3 after deposition of a silicon-containing layer thereupon in accordance with one or more aspects of the present invention.

In an example shown in FIG. 4, which corresponds to the partial semiconductor device shown in FIG. 3, an epitaxial growth process has used to form an active layer 410 over the sacrificial layer 310, where the active layer 410 would eventually become a channel area in subsequent processing steps. In a preferred example, the material of the active layer 410 may be same as the material of the substrate 110.

Further, it may be noted that the material of the sacrificial layer 310, such as, for example, silicon germanium, is substantially more susceptible to oxidation than the active layer 410 or the substrate 110, due to the high oxidation rate of the silicon germanium layer 310 as compared to the oxidation rate of the silicon present in the active region 410 and the bulk semiconductor substrate 110. This difference effectively allows selective oxidation of the sacrificial layer 310 without damage to the active region 410 or substrate 110. The epitaxial growth of the active layer 410 over the sacrificial layer 310 results in a multilayer stacked structure 400, which growth may stem from processes such as CVD or MBE to form the active layer 410, the thickness of which may preferably be about 10 nanometers to about 50 nanometers. In a specific example, the thickness of the active layer 410 may be about 30 nanometers. In one example, the active layer 410, such as a layer of silicon, may be grown by flowing a reactant gas, such as dichlorosilane $SiH_2Cl_2$, trichlorosilane $SiHCl_3$, silicontetrachloride $SiCl_4$ or silane $SiH_4$ together with a carrier gas such as hydrogen gas to form a uniform silicon layer 450.

Figure 5:
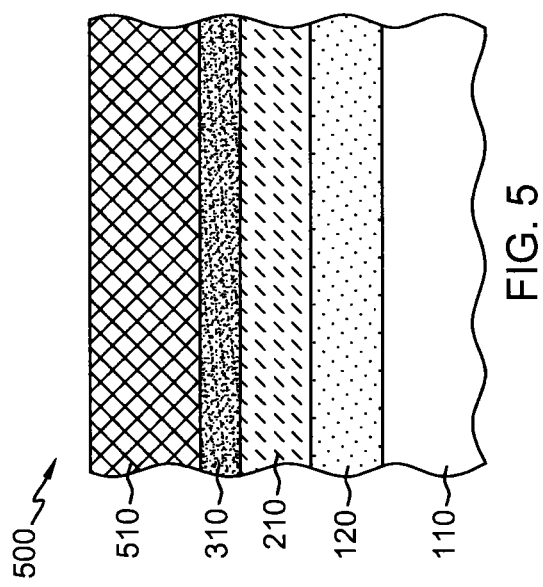
FIG. 5 depicts the partial semiconductor substrate of FIG. 4 after a doping step has been performed in accordance with one or more aspects of the present invention.

A partial semiconductor device 500 shown in FIG. 5 corresponds to that shown in FIG. 4 after performance of a doping step. A p-type dopant may be implanted in p-doped layer 510 using well-known lithographic and implantation techniques. Examples of p-type dopants may include boron, indium, or other acceptors. In other embodiments, a layer may be doped with an n-type dopant instead. By manipulating known parameters of the doping process, a controlled level of doping of p-doped layer may be attained. Optionally, as in this example, p-doped layer 510 may be doped with a higher level of dopant than was n-doped layer 210. In other embodiments, layer 210, whether n-doped or p-doped, may be doped at a higher level that, or the same level as, layer 510, whether n-doped or p-doped.

Figure 6:
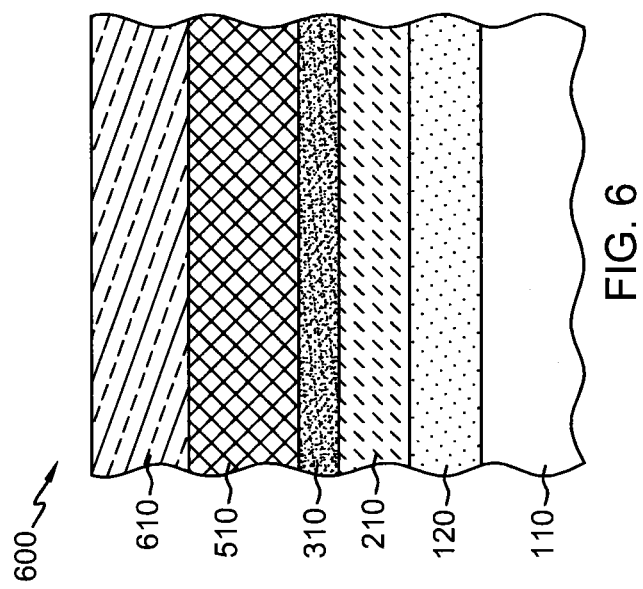
FIG. 6 depicts the partial semiconductor substrate of FIG. 5 after a deposition of a hard mask layer thereupon in accordance with one or more aspects of the present invention.

A partial semiconductor device 600 shown in FIG. 6 corresponds to that shown in FIG. 5 after deposition of a protective mask layer 610. Protective mask layer 610 may be deposited using conventional deposition processes such as, for example, chemical vapor deposition (CVD), low-pressure CVD, or plasma-enhanced CVD (PE-CVD). In one example, protective mask material 610 may include or be fabricated of a material such as silicon nitride. In a specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogen-free precursor such as, for example, bis (t-butylamino)silane (BTBAS) ($SiC_8N_2H_{22}$) and ammonia ($NH_3$) at about 550° C.

Figure 7:
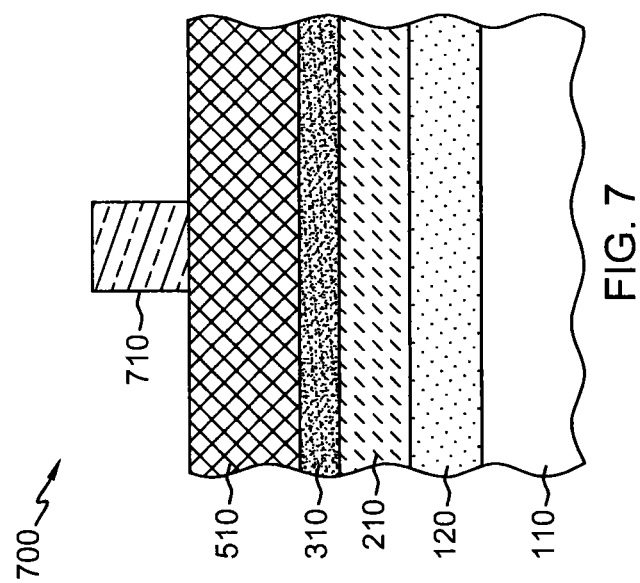
FIG. 7 depicts the partial semiconductor substrate of FIG. 6 after patterned etching of the hard mask layer in accordance with one or more aspects of the present invention.

A partial semiconductor device 700 shown in FIG. 7 corresponds to that shown in FIG. 6 after patterning protective mask layer 610. A lithographic step or steps may have been performed to pattern protective mask layer 610 to leave hard mask 710. A lithographic step or steps or steps may include, for example, providing patterned antireflective and photoresist layers over the protective mask 610 to facilitate etching a pattern therein and removing a portion of protective mask layer 610 to leave hard mask 710.

Figure 8:
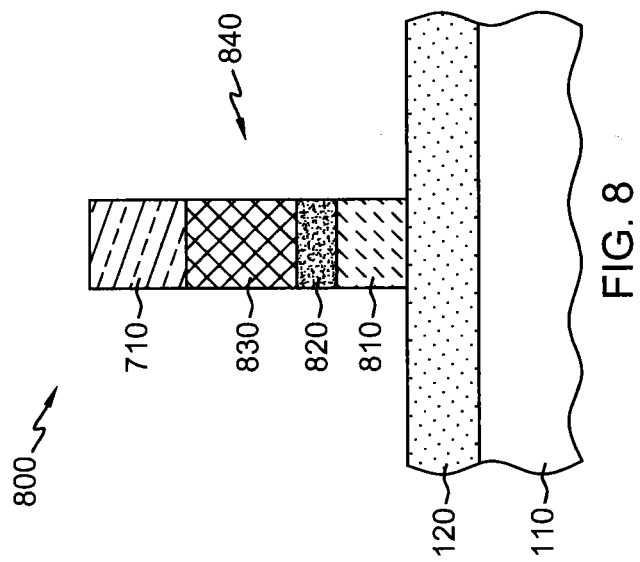
FIG. 8 depicts the partial semiconductor substrate of FIG. 7 after selective etching of the doped layers and the sacrificial layer in accordance with one or more aspects of the present invention.

A partial semiconductor device 800 shown in FIG. 8 corresponds to that shown in FIG. 7 after selectively etching p-doped layer 510, sacrificial layer 310, and p-doped layer 510, to create fin 840. Any suitable conventional etching processes, such as a reactive ion etching process or processes, may be employed to anisotropically etch through regions of p-doped layer 510, sacrificial layer 310, and n-doped layer 210 not protected by hard mask 710, and stop on BOX layer 120, to create fin 840 including hard mask 710, etched p-doped layer 830, etched sacrificial layer 820, and etched n-doped layer 810. In a specific example, the reactive ion etching may be performed using fluorine based chemistry and involving gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$) and oxygen ($O_2$).

Figure 9:
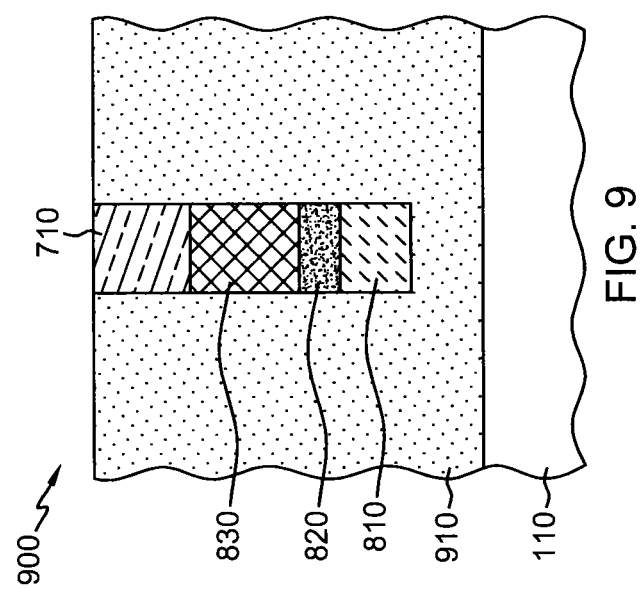
FIG. 9 depicts the partial semiconductor substrate of FIG. 8 after deposition of an oxide layer in accordance with one or more aspects of the present invention.

A partial semiconductor device 900 shown in FIG. 9 corresponds to that shown in FIG. 8 after deposition of oxide material 910. Fin 840 and fins are surrounded with a oxide material 910. Optionally, oxide material 910 may be deposited, for example, by a High Aspect Ratio Process (HARP). Oxide material 910 may be deposited using a variety of techniques such as, for example, chemical vapor deposition (CVD), plasma-enhanced CVD, or sub-atmospheric pressure thermal CVD (SACVD) processes and the thickness of a layer above protective hard mask 710 may be sufficient to allow for subsequent planarization of the structure. For example, high-density plasma (HDP) oxide, high aspect ratio process (HARP)-oxide or tetraethyl orthosilicate (TEOS)-based silicon dioxide may be deposited as oxide material 910 adjacent and surrounding fin 840, and other fins which may also have been fabricated, and above the hard mask 840-topped fin or fins. In one example, the HARP may include using an $O_3$/tetraethyl orthosilicate (TEOS) based sub-atmospheric chemical vapor deposition (SACVD) fill process to result in a conformal deposition of silicon oxide. HARP depositions may be advantageous for gapfill depositions of openings with high aspect ratios, such as between adjacent fins, and may include both a slower deposition rate stage when the slower rate is advantageous for reducing defects, and a higher deposition rate stage when the high rate results in shorter deposition times. Oxide material 910 may serve as a mechanical anchor to provide support to fin 840 during subsequent processing steps.

A chemical-mechanical polish (CMP) or an etch-back polish may be employed to polish away any excess oxide material 910 from above the hard mask 710. Alternatively, excess oxide may be polished away after the performance of other steps that are subsequent to the deposition of oxide material 910 (such as after the selective oxidizing step discussed below with respect to FIG. 10).

Figure 10:
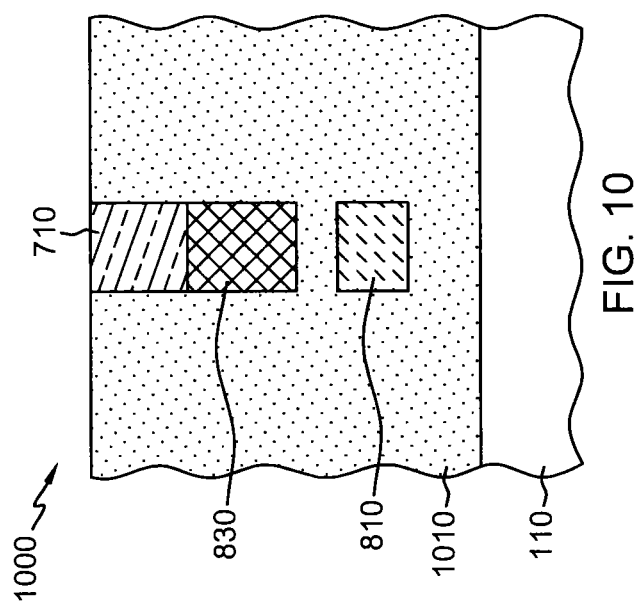
FIG. 10 depicts the partial semiconductor substrate of FIG. 9 after oxidizing the sacrificial layer in accordance with one or more aspects of the present invention.

A partial semiconductor device 1000 shown in FIG. 10 corresponds to that shown in FIG. 9 after selectively oxidizing sacrificial layer 820 through the oxide material 910. In one example, encapsulating the entire fin 840 with oxide material 910 and subjecting it to a prolonged thermal anneal enables the selective oxidation of a sacrificial layer 820 including silicon-germanium. In this anneal-only case, the oxygen required for the oxidation is supplied by an encapsulating oxide layer 910. In another example, oxidation is accomplished with a prolonged annealing process in the presence of oxygen. Oxidizing the sacrificial layer 820 of a fin 840 converts a sacrificial layer 910 to a dielectric, effectively electrically isolating an active region or regions of fin 840—which, in subsequent processing, may become a source, drain, and channel—from the rest of fin 840. A sacrificial layer 820 including SiGe may be transformed into an $SiO_2$ layer between the n-doped layer 810 and the p-doped layer 830. A selective oxidation process may be performed, for example, by subjecting oxide layer 910 to a rapid thermal oxidation (RTO) procedure or by subjecting to a steam annealing procedure. It may be noted that performing the selective oxidation, for example, by annealing the sacrificial layer 820 in the presence of a HARP oxide encapsulating the fins, electrically isolates the active n-doped 810 and p-doped 830 layers by converting sacrificial layer 910 to a dielectric layer, while also providing mechanical/physical stability to the fin structure and preventing the fin structure from tilting due to stress caused by the oxidation of the SiGe layer. There are many different scenarios and time/temperature combinations that would achieve the oxidation. In one example, the rapid thermal oxidation may be performed at about 900° C. for about 15 seconds. In another example, steam annealing may be performed in the presence of water vapor at about 500° C. for about 6 hours.

Figure 11:
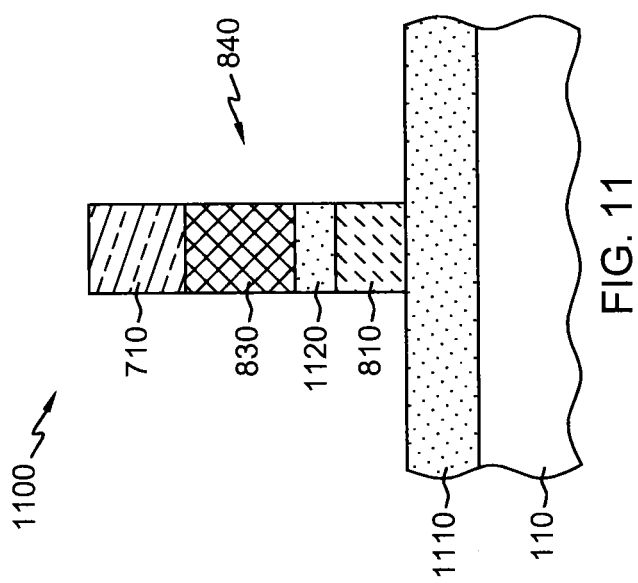
FIG. 11 depicts the partial semiconductor substrate of FIG. 10 after a selective etching of oxide in accordance with one or more aspects of the present invention.

A partial semiconductor device 1100 shown in FIG. 11 corresponds to that shown in FIG. 10 after etching oxide layer 910. A conventional anisotropic etch step such as directional reactive ion etching, may be used to recess back and etch oxide layer 910 to expose fin 840, including sidewalls of n-doped layer 810. A residual thickness of BOX layer 1110 may be left in place as illustrated for this example in FIG. 11. Selectively etching oxide layer 910 to expose fin 840 leaves oxide layer 1120 between p-doped layer 830 and n-doped layer 810.

Figure 12:
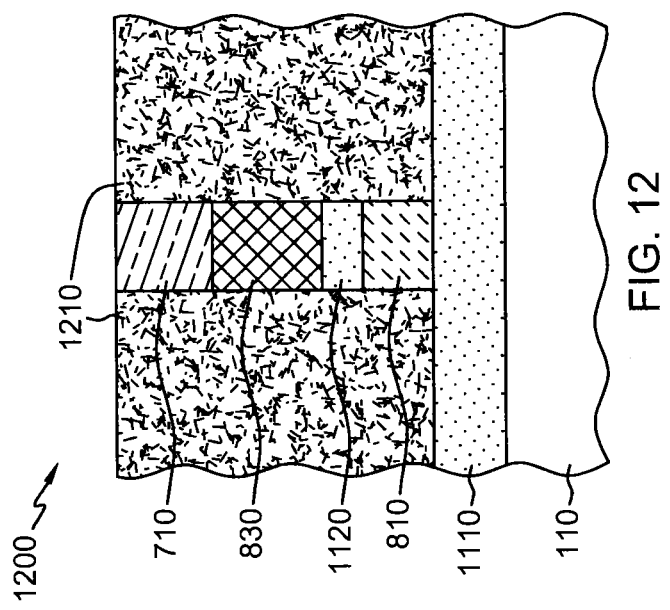
FIG. 12 depicts the partial semiconductor substrate of FIG. 11 after deposition of a gate electrode layer and performing a chemical mechanical planarization step in accordance with one or more aspects of the present invention.

A partial semiconductor device 1200 shown in FIG. 12 corresponds to that shown in FIG. 11 after depositing gate electrode layer 1210. Not shown but optionally included in an example is a high-K layer deposited upon partial semiconductor substrate 1100 before deposition of metal gate layer 1210. For example, with a gate first flow a gate firstly defined by the depositing of gate electrode material 1210 is preserved and used as the final gate electrode. In an example of a poly-Si gate electrode, the poly-Si gate electrode material may be replaced by e.g., "metal-gate" materials using multiple layers of conducting materials e.g., TiN, TaN, TiAl, Al, or W, or combination of these as used in advanced CMOS mode. A gate first approach may be employed in which final gate material is deposited first, or a gate last approach may be used where a sacrificial layer is deposited and remains in place during subsequent processing steps, later to be removed and replaced with a final gate material. In the example shown in FIG. 12, gate material 1210 has been planarized with the surface of hard mask 710. A partial semiconductor device 1300 shown in FIGS. 13A-C corresponds to that shown in FIG. 12 after recessing gate electrode material 1210. Gate electrode material 1310 has been etched to below the surface of hard mask 710 by an etch process that selective for gate electrode material 1310 over hard mask material 710. An isotropic or anisotropic etch process may be used such as, for example, reactive ion etching.

A partial semiconductor device 1400 shown in FIGS. 14A-C corresponds to that shown in FIGS. 13A-C, respectfully, after patterning protective mask layer 710 and selectively etching p-doped layer 830 and oxide layer 1120. A lithographic step or steps may have been performed to pattern protective mask layer 710 to leave hard mask 1430. A lithographic step or steps or steps may include, for example, providing patterned antireflective and photoresist layers over the protective mask 710 to facilitate etching a pattern therein and removing a portion of protective mask layer 710 to leave hard mask 1430. Any suitable conventional etching processes, such as a reactive ion etching process or processes, may then be employed to selectively etch through regions of p-doped layer 830 and sacrificial layer 1120 not protected by hard mask 1430, and stop on n-doped layer 810, to form p-doped layer 1420 and sacrificial layer 1410. In a specific example, the reactive ion etching may be performed using fluorine based chemistry and involving gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$) and oxygen ($O_2$).

Figure 15C:
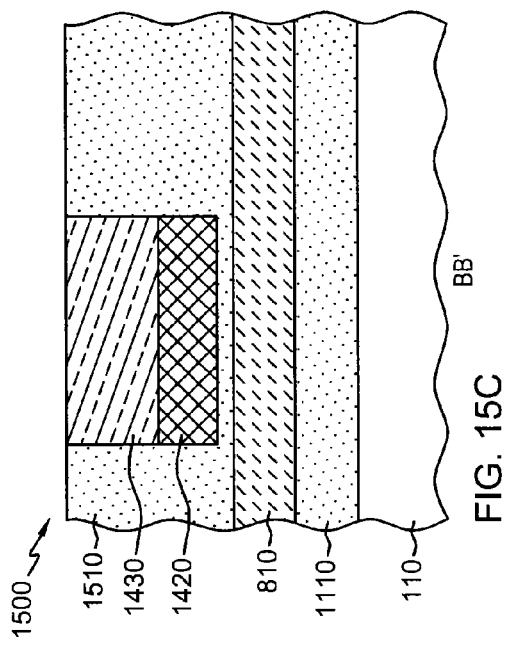
FIGS. 15B and 15C are orthogonal cross-sectional elevation views corresponding to the AA' and BB' sightlines of FIG. 15A, respectively, of partial semiconductor substrate of FIGS. 14A-C, respectively, after deposition of an oxide layer thereupon in accordance with one or more aspects of the present invention.
Figure 15A:
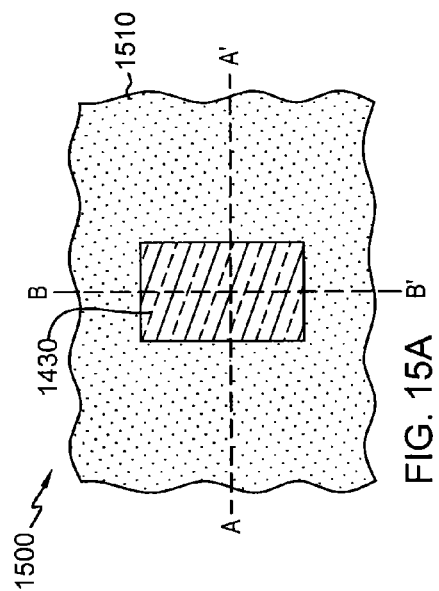
FIG. 15A is a plan view.
Figure 15B:
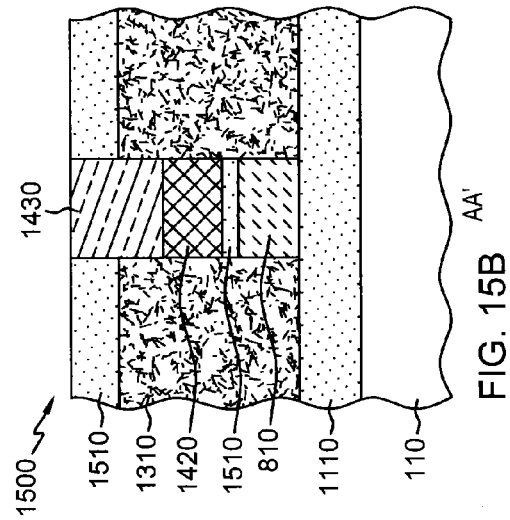

A partial semiconductor device 1500 shown in FIGS. 15A-C corresponds to that shown in FIGS. 14A-C, respectfully, after depositing thereupon and planarizing an interlayer dielectric material 1510 by, for example, a CMP step. A partial semiconductor device 1600 shown in FIGS. 16A-C corresponds to that shown in FIGS. 15A-C, respectfully, after patterning active layer contacts. In this example, interlayer dielectric material 1610 was patterned to expose gate electrode layer 1310 and n-type doped layer 810, and hard mask layer 1620 was patterned to expose p-type doped layers, by well-known lithographic techniques.

A partial semiconductor device 1700 shown in FIGS. 17A-C corresponds to that shown in FIGS. 16A-C, respectfully, after a metallizing step. Metallization entails disposing conductive metals, such as tungsten, copper or aluminum, in contact openings patterned so as to permit electrical contact with active layers. It would be understood by skilled artisans that well-known, standard techniques, involving metallic layer deposition and photolithographic patterning and etching, may be employed in a metallization process. Metal contacts are made with gate electrode material 1310, and active layers p-doped layer 1420 and n-doped layer 810. Contact Input-1 1710 and Input-2 1720 contact gate electrode material 1310. Ground (GND) 1730 contacts n-doped layer 810, power supply ($V_{DD}$) 1740 contacts p-doped layer 1420, and Output contacts both active layers p-doped layer 1420 and n-doped layer 810.

Once incorporated into a completed semiconductor circuit, partial semiconductor circuit 1700 functions to incorporate activity of multiple independent gates within a single fin. In this example, n-doped layer 810 and p-doped layer 1420 include aspects of two, three-dimensionally stacked gates within fin 840. Conventionally, active regions include a source and drain, separated by a differentially doped channel region underlying a gate. In accordance with one aspect of the present invention, however, a source, drain, and channel region in an active layer, whether p-doped or n-doped, are doped at concentrations that do not differ, forming a gate lacking a junction between source and drain.

In an example, a p-doped layer 1420 may be doped at a higher concentration of dopant than is an n-doped layer 810 and function as a pull-up network. Such p-doped layer 1420 would be blocked only if Input-1 1710 and Input-2 1720 are active. Otherwise, a region of depleted concentration of charge carrier induced from one of the gates is not wide enough to occlude current flow through the channel between source and drain. In another example, an n-doped layer 810 may be doped at a lower concentration of dopant than a p-doped layer 1420 and function as a pull-down network. Such n-doped layer 810 would conduct only if both Input-1 1710 and Input-2 1720 are active. Otherwise, a region of depleted concentration of charge carrier induced from one of the gates is wide enough to occlude current flow through the channel between source and drain. In accordance with the present invention, stacking active layers n-doped layer 810 and p-doped layer 1420 in a single fin 840, and controlling each active layer n-doped layer 810 and p-doped layer 1420 with two independent gates (separated by hard mask layer 1620) results in a single transistor with NAND2 functionality. FIG. 18 is a truth table demonstrating the NAND2 functionality of this embodiment depending on whether one, the other, neither, or both of Input-1 1710 and Input-2 1720 are active.

Figure 19A:
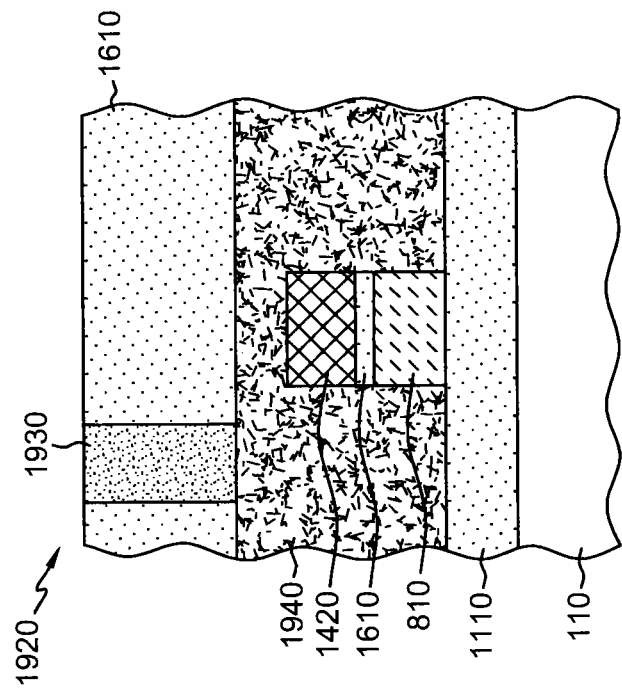
FIGS. 19A and 19B are an inverter gate in accordance with one or more aspects of the present invention.
Figure 19B:
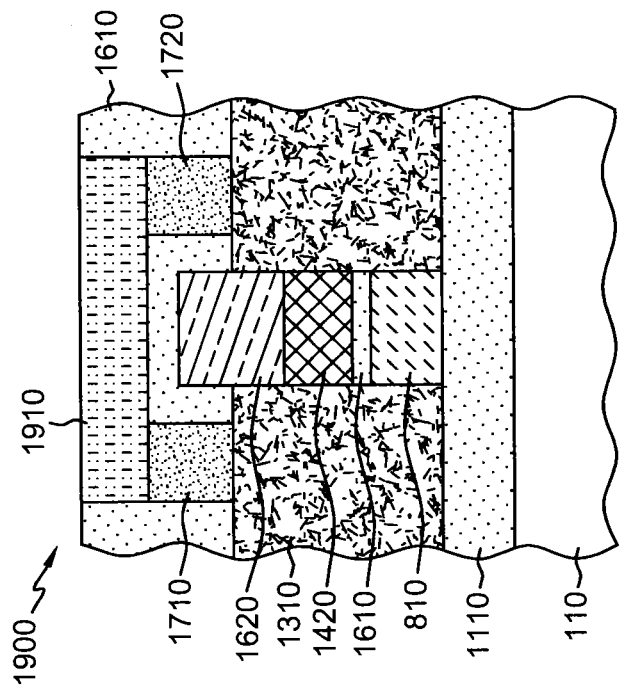

In other embodiments, in accordance with the present invention, active layers stacked within a single fin, without a dopant-gradient junction between source and drain, a logic gate with inverter functionality may be obtained. FIGS. 19A-B show different embodiments of an inverter. A partial semiconductor device 1900 shown in FIG. 19A corresponds generally to that shown in FIG. 17A except that an input layer 1910 has been deposited, effectively connecting Input-1 1710 with Input-2 1720. A partial semiconductor device 1920 shown in FIG. 19B corresponds generally to that shown in FIG. 17A except that no hard mask 1620 separates electrode gate material 1310, resulting in gate electrode material 1940. In both of these examples, by effectively shorting inputs to gates on either side of active layers n-type layer 810 and p-type layer 1420, a transistor with the same footprint as a NAND2 transistor such as illustrated in FIG. 17A can be fabricated to function as an inverter.

Figure 20A:
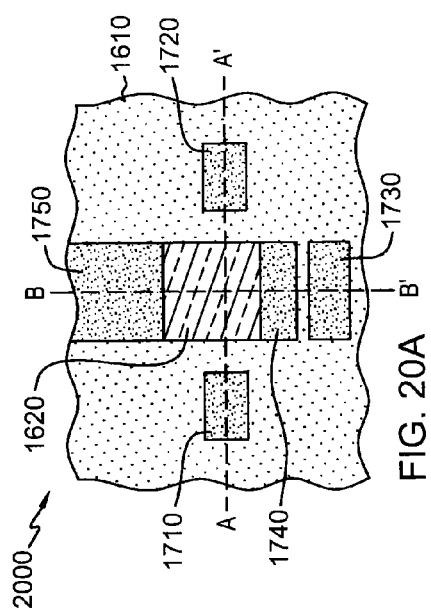
FIG. 20A is a plan view.
Figure 20B:
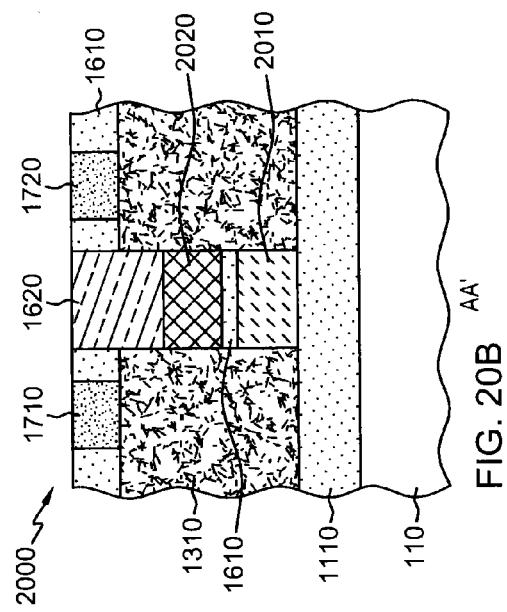
FIGS. 20B and 20C are orthogonal cross-sectional elevation views corresponding to the AA' and BB' sightlines of FIG. 20A, respectively, of a NOR2 gate in accordance with one or more aspects of the present invention.
Figure 20C:
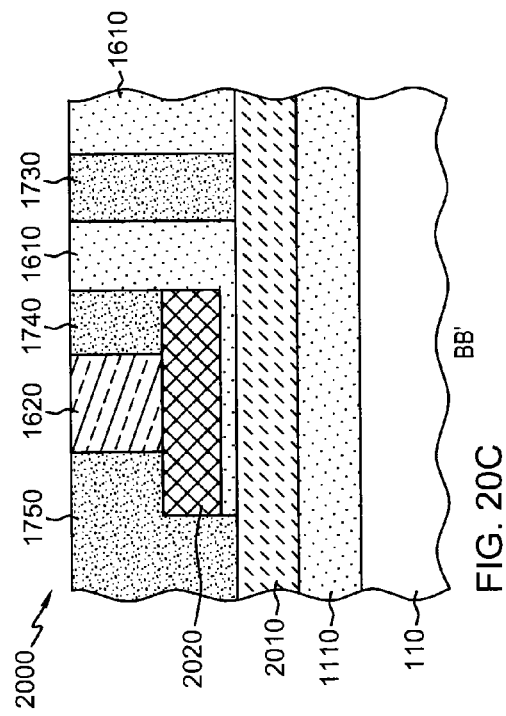

In other embodiments, in accordance with the present invention, a transistor with NOR2 functionality can be obtained. A partial semiconductor device 2000 shown in FIGS. 20A-C corresponds to that shown in FIGS. 17A-C, respectfully, except that, whereas in an example such as illustrated in FIGS. 17A-C where dopant concentration is higher in p-doped layer 1420 than in n-doped layer 810, in FIGS. 20A-C p-doped layer 2020 has a dopant concentration lower than that of n-doped layer 2010. By reversing the relative differential in dopant concentration in active layers p-type dopant layer and n-type dopant layer relative to a NAND2 transistor such as illustrated in FIGS. 17A-C, a transistor with the same footprint can be fabricated to function as a NOR2 transistor.

In other embodiments, differentiating between a pull-up and pull-down network, or between OR and AND functionality of a given active layer and accompanying gate, can be accomplished by fabricating a fin with multiple active layers whose widths differ from each other while their doping n- and p-type doping levels remain equal. Partial semiconductor devices 2100 and 2110 are shown in FIGS. 21A-B, respectively, and correspond generally to that shown in FIG. 17A, except that the widths of and n-doped layer differs from that of a p-doped layer and, in the case of partial semiconductor device 2110, p-doped layer 2150 is below n-doped layer 2160. In accordance with the present invention, AND functionality may be accomplished with a relatively narrower fin width. In such cases, a region depleted of charge carriers may occlude a channel and prevent the flow of current from source to drain unless both Input-1 1710 and Input-2 1720 are active to contract a deprived region or regions and permit a continuous expanse of carrier-containing material in the channel connecting source to drain. In conversely, OR functionality may be accomplished with a relatively wider fin width. In such cases, a region depleted of charge carriers may be too narrow to occlude a relatively wider channel and prevent the flow of current from source to drain if either Input-1 1710 or Input-2 1720, or both, are active to contract a deprived region or regions and permit a continuous expanse of carrier-containing material in the channel connecting source to drain. An appropriate fin width may be determined based on a doping level. In an example, for fins doped at relatively higher concentrations (e.g., $1\times10^{19}$-$1\times10^{20}$/cm3), fin widths may be between 5 and 10 nm. A p-doped layer 2130 may be narrower than an n-doped layer 810, or an n-doped layer 2160 may be narrower than a p-doped layer 2150. In the embodiments illustrated in FIGS. 21A-B, a wider active layer is below a narrower active layer but it would be understood by skilled artisans that a narrower active layer may be below a wider active layer in accordance with the present invention. Dopant concentration may also differ between active layers in addition to their differing widths to combine the effects of different dopant concentrations with different fin widths in attaining AND or OR, or pull-up or pull-down functionality.

Figure 22A:
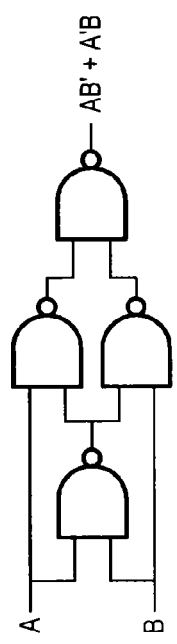
FIGS. 22A and 22B are a circuit diagram and a plan view, respectively, of a transistor logic circuit in accordance with one or more aspects of the present invention.
Figure 22B:
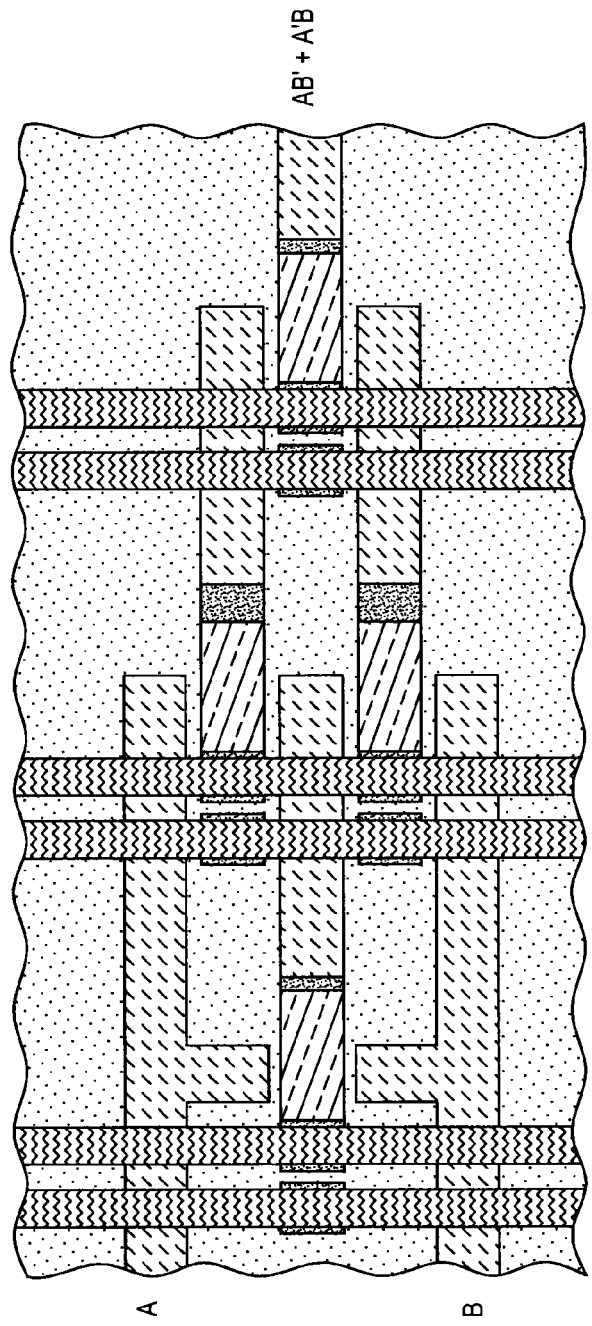

It would be understood that modular NAND2 transistors described herein could be modified or combined to create any other logic function. Similarly, NOR2 or inverter transistors could also be modified or included in more complicated circuits to create any desired logic function. A modularity and compact design of transistors in accordance with the present invention allows for increased variety of functionality in circuits occupying reduced surface area on a semiconductor substrate. For example, FIGS. 22A-B illustrate how NAND2 gates constructed in accordance with the present invention may be combined in a circuit to yield XOR2. FIG. 22A is a circuit diagram and FIG. 22B is an overhead view of transistors fabricated and wired together in a circuit in accordance with the present invention to yield, in one embodiment, XOR2 functionality. NAND2, NOR2, and inverter transistors, or a combination or combinations of one or more of the foregoing, can be wired together in a wide variety of circuit structures, all of which can be envisaged as embodiments of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor structure comprising
one or more fins disposed on a substrate, wherein the one or more fins comprise:
a first active layer disposed on said substrate comprising a first source, a first channel, and a first drain, wherein the first source, first channel, and first drain are doped with a concentration of a first dopant and the concentration of the first dopant is the same in the first channel as it is in the first source and the first drain;
a dielectric layer disposed on the first active layer;
a second active layer disposed on the dielectric layer comprising a second source, a second channel, and a second drain, wherein the second source, second channel, and second drain are doped with a concentration of a second dopant and the concentration of the second dopant is the same in the second channel as it is in the second source and the second drain;
a first gate disposed on a first sidewall of the first channel and of the second channel; and
a second gate disposed on a second sidewall of the first channel and of the second channel wherein the second sidewall is opposite the first sidewall.

2. The semiconductor structure of claim 1 wherein the substrate comprises a silicon-on-insulator substrate.

3. The semiconductor structure of claim 1 wherein the dielectric layer comprises silicon-oxide.

4. The semiconductor structure of claim 1 wherein the first dopant is the same as the second dopant and the concentration of the first dopant is different from the concentration of the second dopant or one of the first dopant and the second dopant comprises a p-type dopant and another of the first dopant and second dopant comprises an n-type dopant.

5. The semiconductor structure of claim 4 wherein the p-type dopant comprises boron, aluminum, gallium, indium, and the n-type dopant comprises antimony, arsenic, or phosphorous.

6. The semiconductor structure of claim 1 wherein the dielectric layer comprises oxidized silicon-germanium.

7. The semiconductor structure of claim 1 wherein the first gate contacts the second gate or wherein the semiconductor structure of claim 1 comprises one electrical input that controls both the first gate and the second gate.

8. The semiconductor structure of claim 1 wherein the first active layer comprises a first fin width between the first gate and the second gate and the second active layer comprises a second fin width between the first gate and the second gate and the first fin width is larger or smaller than the second fin width.

9. The semiconductor structure of claim 4 comprising a logic gate, wherein the logic gate is a NAND2 type, a NOR2 type, or an inverter type.

10. The semiconductor structure of claim 9 wherein the semiconductor structure comprises a logic circuit and the logic circuit comprises a plurality of NAND2 logic gates.

11. A method of making a semiconductor structure comprising:
disposing a first active layer on a semiconductor substrate and doping the first active layer with a first dopant;
disposing a sacrificial layer on the first active layer wherein the sacrificial layer comprises an oxidizable material;
disposing a second active layer on the sacrificial layer and doping the second active layer with a second dopant;

etching the first active layer, the sacrificial layer, and the second active layer wherein etching comprises forming one or more fins;

oxidizing the sacrificial layer wherein oxidizing comprises transforming the sacrificial layer into a dielectric layer;

disposing a first gate on a first sidewall of the one or more fins and a second gate on a second sidewall of the one or more fins wherein the first gate is opposite the second gate; and wherein disposing comprises forming a first source, a first channel, and a first drain in the first active layer having a concentration of the first dopant that does not substantially differ between the first source, first channel, and first drain, and a second source, a second channel, and a second drain in the second active layer having a concentration of the second dopant that does not substantially differ between the second source, second channel, and second drain.

12. The method of claim 11 wherein the semiconductor substrate comprises a silicon-on-insulator substrate.

13. The method of claim 11 wherein the oxidizable material comprises silicon germanium $Si_{(1-x)}Ge_x$, wherein $0<x<1$.

14. The method of claim 13 wherein oxidizing the sacrificial layer comprises conformally depositing an oxide so as to encapsulate the at least one fin and annealing the at least one fin and conformal oxide to oxidize the sacrificial layer therein.

15. The method of claim 11 wherein the first dopant is the same as the second dopant and the concentration of the first dopant is different from the concentration of the second dopant or one of the first dopant and second dopant comprises a p-type dopant and another of the first dopant and second dopant comprises an n-type dopant.

16. The method of claim 15 wherein the p-type dopant comprises boron, aluminum, gallium, or indium and the n-type dopant comprises antimony, arsenic, or phosphorous.

17. The method of claim 11 wherein doping the first active layer with the first dopant occurs after disposing the second active layer on the sacrificial layer.

18. The method of claim 11 wherein disposing the sacrificial layer comprises epitaxially growing the sacrificial layer.

19. The method of claim 15 wherein the semiconductor structure comprises a NAND2 logic gate, a NOR2 logic gate, or an inverter.

20. The method of claim 19 wherein the semiconductor structure comprises a logic circuit and the logic circuit comprises a plurality of NAND2 logic gates.

* * * * *